United States Patent [19]
Chan et al.

[11] Patent Number: 5,342,805
[45] Date of Patent: Aug. 30, 1994

[54] METHOD OF GROWING A SEMICONDUCTOR MATERIAL BY EPILAXY

[75] Inventors: Joseph Y. Chan, Kings Park; Larry Laterza, Miller Place; Dennis Garbis, Huntington Station, all of N.Y.; William G. Einthoven, Belle Mead, N.J.

[73] Assignee: G.I. Corporation, Hatboro, Pa.

[21] Appl. No.: 82,951

[22] Filed: Jul. 1, 1993

[51] Int. Cl.$^5$ ............................................. H01L 21/20
[52] U.S. Cl. ........................................ 117/89; 117/93; 117/935; 117/938; 117/939
[58] Field of Search ................ 437/131, 105; 156/610, 156/613

[56] References Cited

U.S. PATENT DOCUMENTS 5,084,411 1/1992 Laderman et al. .................. 437/131
5,097,308 3/1992 Salih .................................. 257/578

*Primary Examiner*—R. Bruce Breneman
*Assistant Examiner*—Ramamohan Rao Paladugu
*Attorney, Agent, or Firm*—James & Franklin

[57] ABSTRACT

This invention concerns itself with an improved method of producing sharply defined misfit dislocations; (MD) with a new, inexpensive method of doping these misfit dislocations with Au; with invention that a combination of Au and Pt doping in misfit dislocations is superior to any amount of Au and to some specific placements of the misfit dislocations in the device structure.

11 Claims, 3 Drawing Sheets

METHOD OF GROWING A SEMICONDUCTOR MATERIAL BY EPILAXY

The present invention relates to a process for fabricating epitaxial material for the manufacture of bipolar power semiconductor devices, and in particular to a process for making epitaxial material through the use of misfit dislocations which permits improved control of the switching speed or other lifetime dependent parameters of such devices.

It is known that the switching speed of silicon bipolar devices can be increased by the introduction of heavy metallic impurities in the active region of the device. The impurities significantly reduce minority-carrier lifetime and as a result shorten reverses recovery time. Gold and platinum impurities are often used, and are rapidly diffused into this silicon. However, the solid solubilities of these impurities in silicon are very small and they tend to precipitate or segregate at defects, disordered regions, and surfaces. Their diffusion is therefore difficult to control and is sensitive to process conditions, particularly the diffusion temperature and time, and also cooling rate (after the diffusion) in certain temperature ranges.

U.S. Pat. No. 5,097,308 issued Mar. 7, 1992 and U.S. Pat. No. 5,102,810 issued Apr. 7, 1992, both to Ali Salih, are directed to a method for controlling the switching speed of bipolar power devices through the use of misfit dislocations in the depletion region. The misfit dislocation are formed during epitaxial growth by creating a silicon/silicon-germanium interface.

These state of the art patented inventions utilize misfit dislocations to lower the minority lifetime in semiconductor devices. This can be used to enhance the switching speed of power rectifiers, particularly fast recovery power rectifiers with misfit dislocations it becomes possible to obtain localized regions in the device with low minority lifetime close to regions with a high minority lifetime. It also allows for a great amount of freedom to place these misfit dislocations in favorable locations. Misfit dislocations produce relative small leakage currents and are metallurgically and electrically stable, and thus, device performance does not significantly deteriorate under high power and temperature applications. Unlike processes where misfit dislocations had been previously used to remove impurities from the space charge region, in the patented invention, the misfit dislocations are used to directly reduce minority carrier lifetime. That becomes possible because they are associated with deep energy levels in the energy gap of silicon, like metallic impurities.

The misfit dislocations are formed by growing a thin layer of silicon containing a few percent Ge somewhere in the epi layer of "pure" silicon (substantially Ge free). The two interfaces of the silicon without Ge and the thin layer of silicon containing a few percent Ge are strained, because the crystal lattices of the bordering layers do not exactly match. As a result dislocations appear at these interfaces.

Unlike metal impurities and structural defects formed by electron beam irradiation, misfit dislocations are permanent defects that are not sensitive to high temperature processing short of melting the silicon material. They are also localized, having their influence in well defined narrow regions in the Si device. They are formed during the epitaxial growth and do not require additional processing steps as ones used to introduce metal impurities and structural defects. Thus, misfit dislocations are used effectively as a more versatile alternative to metal diffusion with the added advantage of localization of their effects. The misfit dislocations can also be used as a complement to metal diffusion to obtain significantly better results than conventional impurity introduction techniques. Flexible tailoring of recovery characteristics can be achieved by adjusting the placing of the dislocations as well as a adjusting the densities of both misfit dislocations and metal impurities combined in the same device.

The above described patented process teaches forming the silicon/silicon-germanium interface during epitaxy by growing a silicon layer with 2% or 3% germanium and thereafter growing a "pure" silicon layer. However, as a practical matter, it is difficult to achieve a "pure" (substantially germanium free) silicon layer after the silicon-germanium layer is formed because of residual germanium which remains in the reactor system. One of the prime objects of the present invention is to provide a method whereby silicon layers which are not contaminated with germanium can be formed after silicon-germanium layers are fabricated in a CVD reactor during epitaxy.

The patented method teaches placement of the silicon/silicon-germanium interface near the middle of the depletion region. The present invention provides for the possibility of placement of the misfit dislocation regions near or even outside the boundary of the depletion layer.

The patented method suggests the diffusion of metallic impurities as a complement to the use of misfit dislocations. The present invention teaches that the simultaneous diffusion of gold and platinum impurities appears to provide optimum results.

The present invention also teaches that the placement of a Au doped wafer in the epi reactor during the growing of the epi layers, amidst the substrate wafers on which the epi layer is grown, will be a useful source of Au. The grown epi layers pick up enough Au, which diffuses and ends up mainly in the misfit dislocation regions.

As the reader will no doubt note, the process here disclosed is entirely epitaxial in nature and can be performed completely in a single CVD reactor. In that sense, it is similar to the process and material disclosed in Copending application Ser. No. 08/015,384 filed Feb. 9, 1993 in the name of Joseph Chan et al. entitled Multilayer Epitaxial Structure and Method For Fabricating Same and owned by the assignee hereof. That application teaches an all epitaxial process in which a heavily doped layer is grown on a lightly doped substrate. To minimize out diffusion, the substrate is "capped" by growing very thin and heavily doped silicon layers which are depleted by hydrogen purges. The epitaxial layers are then grown over the capped substrate. Those aspects are effectively utilized in the present invention which combines same with some of the features of the Salih patented process to obtain a more advantageous result.

To minimize contamination of the gas flow lines and reactor surfaces from the high impurity concentrations necessary in the CVD reactor when performing the epitaxial process, a unique gas flow system is employed in the CVD reactor. That system is described in co-pending Application Ser. No. 08/015,658 filed Feb. 9, 1993 in the name of Joseph Chan, et al. entitled Gas Flow System For CVD Reactor and owned by the assignee hereof. The gas flow system there described may be employed advantageously in the present invention as well.

It is, therefore, a prime object of the present invention to provide an improved semiconductor material and a method for controlling the minority lifetime, and with this lifetime the switching speed of devices formed therein where germanium contamination of silicon layers, which are formed in the CVD reactor after germanium containing layers, is substantially reduced.

It is another object of the present invention to provide an improved semiconductor material and a method of controlling the minority carrier lifetime, and for example with the help of this lifetime controlling the switching speed of devices formed therein in which gold and platinum impurities are diffused simultaneously as a complement to the misfit dislocation process.

It is another object of the present invention to provide an improved semiconductor material and a method for controlling the minority carrier lifetime in regions of devices formed therein in which the misfit dislocations are located in a region proximate to or outside a depletion region or outside a space charge region in the case of a forward biased junction.

It is another object of the present invention to provide an improved semiconductor material and a method for controlling the minority carrier lifetime in specific regions of devices formed therein in which a gold diffusion is performed during the epi growing steps by replacing one of the wafers in the epi susceptor by a gold doped wafer as a source of gold for the other wafers.

In accordance with one aspect of the present invention, a method is provided for fabricating an improved epitaxial material (see FIG. 2). In the CVD reactor, an epitaxial layer is grown on a silicon substrate. The layer includes a first region containing misfit dislocations. Germanium containing gas is introduced into the reactor chamber as the substrate temperature is reduced to 1150° C. to grow a $2\mu$ thick silicon layer containing for example 3% germanium. Next the chamber is then purged. A layer of substantially germanium free silicon is then grown again, $2\mu$ thick. Germanium containing gas is again introduced into the chamber to form a second germanium containing layer, $2\mu$ thick. The chamber is purged after the second germanium containing layer is formed. During this purge the temperature is increased. A second substantially germanium free silicon layer ($2\mu$ thick) is grown on the etched surface of the second germanium containing layer. The chamber is purged again. Next another $2\mu$ substantially germanium free silicon layer is formed. Finally the surface of this last layer, is etched to remove a significant part of it. HCl gas is introduced to back etch about one micron of the silicon layer surface. This is to remove unwanted germanium residue which has settled on the wall of the vapor deposition chamber thereby preventing further unwanted silicon germanium deposition.

A second region of several misfit dislocations may be formed at a location spaced from the first region. A third region of misfit dislocations may be formed at a location spaced from the second region.

The material may then be subjected to diffusion to form a P/N junction.

The method further comprises the step of simultaneously introducing gold and platinum impurities into the first region.

In accordance with a second aspect of the present invention, material within which to fabricate a bipolar power semiconductor device is provided. The material includes a silicon substrate with first and second surface areas. An epitaxial layer is formed on the substrate. The epitaxial layer includes a layer that in the finished device will become a depletion region of a first conductivity type. A region in the epitaxial layer is formed under conditions which result in misfit dislocations as described above.

Gold and platinum impurities are introduced into the region of misfit dislocations simultaneously by a separate diffusion.

To these and such other objects which may hereinafter appear, the present invention relates to an improved semiconductor material and a method for controlling the switching speed of devices formed therein, as set forth in detail in the following specification and recited in the annexed claims, taken together with the following drawings, wherein like numerals relate to like parts and in which:

The invention utilizes misfit dislocation regions formed in or close to the depletion region. These regions function as an alternative and a complement to metal diffusion for enhancement of switching characteristics of power rectifiers. The misfit dislocations are formed in a silicon epitaxial layer in the depletion region in material which will become a bipolar power semiconductor device, such as a rectifier, before the rectifying junction is diffused. The misfit dislocations serve as lifetime killers and also as getter sites for metallic impurities. A small amount of metallic atoms, preferably a mix of gold and platinum, will be simultaneously diffused into the misfit dislocation region and will remain there in larger concentrations than outside the misfit dislocation regions, leaving the surface and the remaining depletion region with minimal metallic precipitates. The end result, if the place for the misfit dislocation region is well chosen, is a very fast switching rectifier with relatively low forward voltage and leakage current.

The process of the present invention has been successfully demonstrated with a rectifier having a switching speed about 25 nano seconds and a breakdown voltage of approximately 700 to 800 volts. The process is particularly well suited for use in high voltage, very fast switching power rectifiers rated at less than 1000 volts.

DESCRIPTION OF PREFERRED EMBODIMENT

Figure 1:
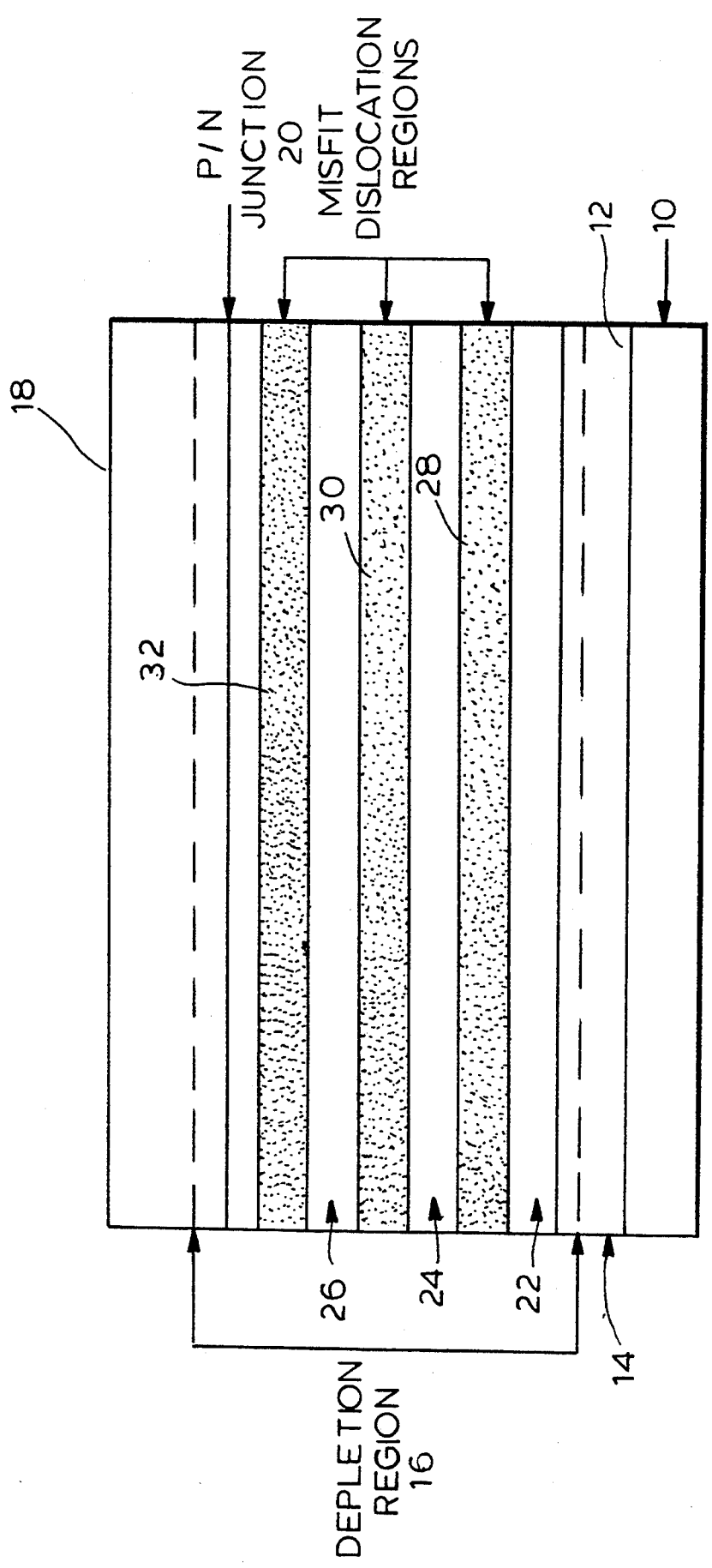
FIG. 1 is a schematic cross-sectional view of a portion of a bipolar power semiconductor device formed in the material of one of the embodiments of the present invention illustrating the placement of three spaced regions of misfit dislocations.

By way of an example, the process may start with an N type substrate 10 (see FIG. 1) of Arsenic doped silicon of less than 0.005 ohm-cm resistivity with crystal orientation of <1-0-0>. The substrate is preferably capped as taught in Application Ser. No. 08/015,384 referred to above. A N− silicon epitaxial layer is grown (in a vapor deposition reactor chamber) over the substrate. In this epi layer three regions are grown with misfit dislocations. The placement of the regions is such that when processing is finished, these misfit dislocation regions end up in or close to the depletion region, which is a fully reverse biased P-N junction.

Figure 2:
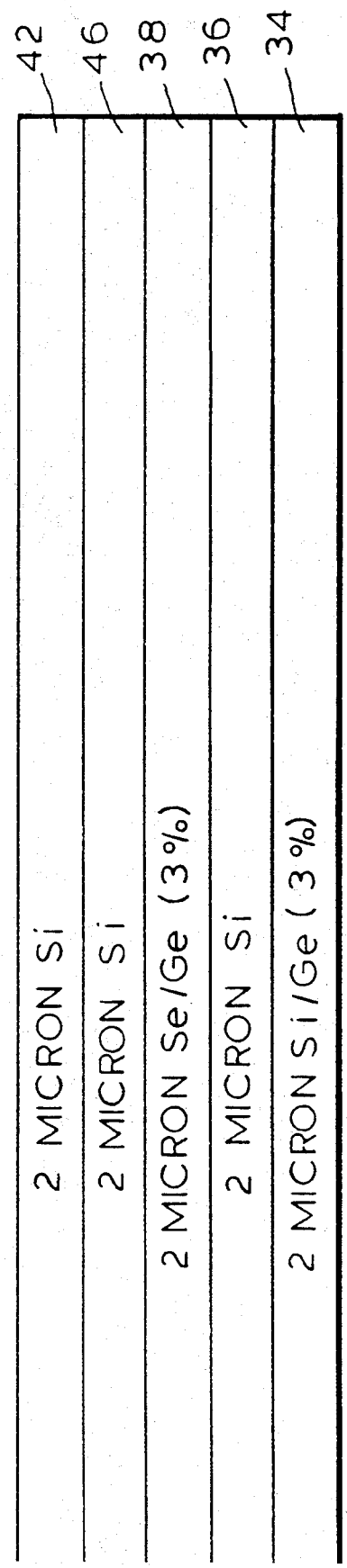
FIG. 2 is a schematic cross-section and view of one of these three region of misfit dislocations shown in FIG. 1.

Each misfit dislocation region consists of two 2 micron thick layers of silicon with 3% germanium, separated by a 2 micron layer of silicon with no germanium (see FIG. 2). Two layers of two microns thick silicon sub layers are deposited on top of the second SiGe layer.

More particularly, above capped surface 12 of substrate 10 the epitaxial layer is grown. After the device is finished the epitaxial layer will include an N++ out diffusion buffer region 14. A P+ diffused region 18 is diffused into this epitaxial layer to create a P-N junction 20. If this P-N junction is reverse biased, a depletion region 16 will sustain the bias voltage.

Depletion region 16 will contain N-type silicon with regions 22, 24 and 26 separated by regions 28, 30 and 32 containing misfit dislocations. Each of the misfit dislocation regions 28, 30 and 32 are preferably formed of five layers each approximately 2 microns thick.

A typical region 28, 30 and 32 including misfit dislocations is illustrated in FIG. 2. With the temperature of the CVD reactor chamber lowered 50° C. to 1050° C., a first germanium containing layer 34 (Si/Ge) of approximately 3% germanium is grown. It is approximately 2 microns thick. Next a 4 min. hydrogen purge is performed to clean the gas in the chamber. A first substantially germanium free silicon layer 36 is then grown over layer 34. Layer 36 is also approximately 2 microns thick.

On top of layer 36 a second germanium containing layer 318 is grown (Si/Ge) which is similar to layer 34 in composition and thickness. After this another purge. During this purge the temperature is raised to 1100° C. Above layer 38 another substantially germanium free layer 40 is grown. Then another purge and another substantially germanium free layer 42. Silicon sublayers 40 and 42, each are approximately two microns thick. Finally a gas etch etches away a part of layer 42 and another 4 min. hydrogen purge removes the etching gases.

Each multi-layer region of misfit dislocations has a thickness of approximately 10 microns. The regions are spaced apart by N-silicon regions 24 and 26 of approximately 13 microns thickness. Adjacent the surface of region 32 of misfit dislocations is grown an approximately 45 micron thick silicon buffer. A portion of the buffer will be diffused with a P type impurity to form a P+ type region 18 with a P/N junction 20. The regions of misfit dislocations are preferably proximate to junction 20.

Figure 3:
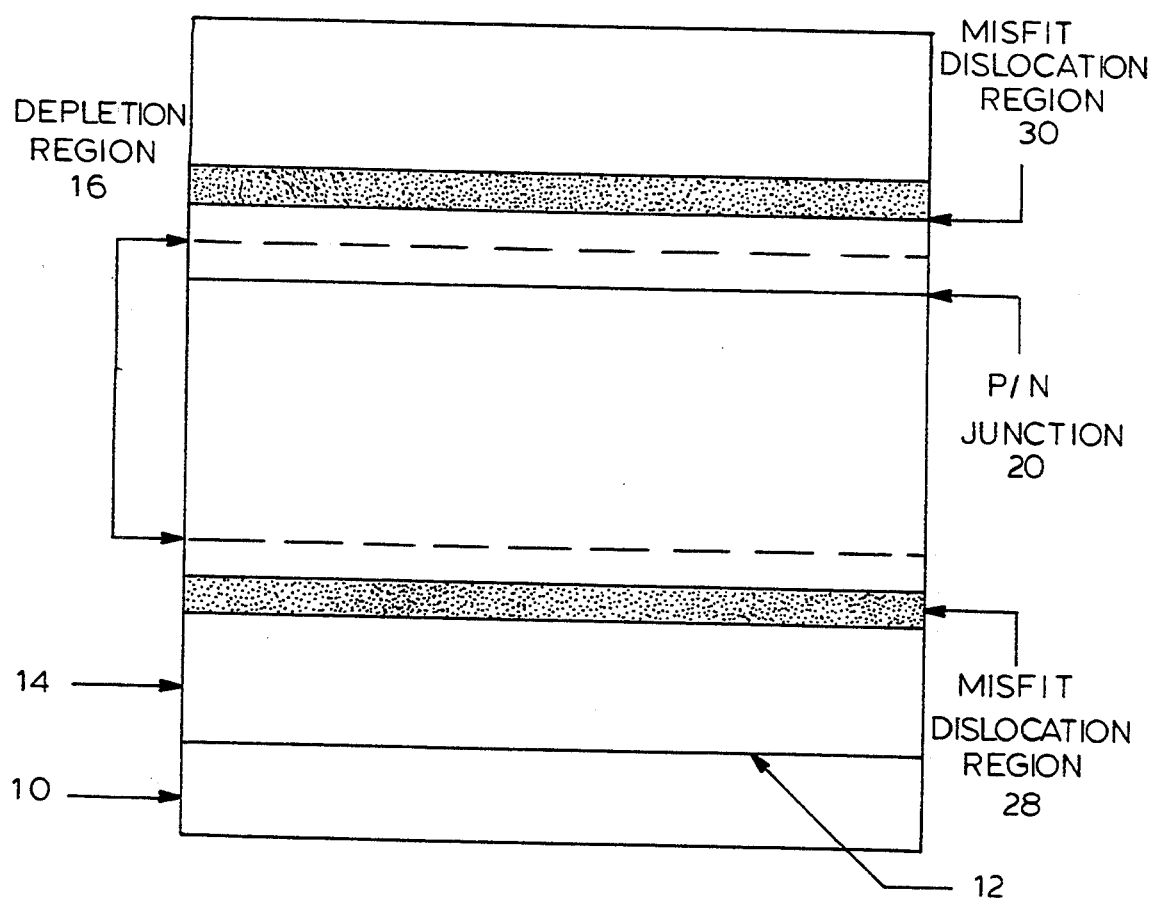
FIG. 3 is a schematic cross-sectional view like FIG. 1, but of another embodiment of the present invention.

FIG. 3 shows the case where the misfit dislocation regions 28 and 30 are situated just outside the depletion region 16. The misfit dislocation regions are the same as earlier described and shown in FIG. 2, however preferably with one two or more Ge doped layers.

The advantage of this system is found primarily the leakage current IR and to a lesser extent to the forward voltage drop Vf. Hole-electron generation in the depletion layer is by far the largest component of the IR. Diffusing metallic impurities all through the wafer to lower the minority carrier lifetime (as is currently the standard manner of achieving this) is known to increase the IR because the generation component of IR is evenly proportional to the lifetime.

$$IR\ (gen) = q\ ni\ (\text{Vol. of depl region})/n.\tau$$

where
IR (gen) is the generation part of the leakage current.
ni is the intrinsic carrier concentration.
q is the electron charge ($1.6 \times 10 - 19$ coul. current)
$\tau$ is the lifetime
n is a constant. For a midband energy level n=2

If the $\tau$ in the depletion region is large, IR is small. If $\tau$ just outside the depletion region is small, the recombination there will diminish the charge in the space charge region when the rectifier is forward biased, which will result in a faster switching time. The misfit dislocations in this case must have more regions or more germanium in each $2\mu$ region or more gold or/and Pt to achieve the same switching time as in the case of FIG. 1. In some cases only one of the misfit dislocation regions might be the preferred embodiment. A similar reasoning is in special cases true for the spare charge region.

As noted above, increasing the switching speed of silicon devices has been conventionally accomplished by the introduction of heavy metallic impurities, which tend to reduce minority carrier lifetime and therefore result in devices with a shorter recovery time but with a higher IR due to the metallic impurities such as gold and platinum which have been used.

In a special case of the present invention, misfit dislocations as well as metal diffusion are employed to enhance the switching speed in devices such as power rectifiers. The misfit dislocations serve as getter cites of the metallic impurities. The metallic impurities are diffused all through the silicon and end up into the misfit dislocation regions as the regions are formed and remain in those regions in relatively large concentrations, as compared to the surface and remainder of the depletion region. The source of these metallic impurities can be a gold doped wafer in the vapor deposition reactor chamber.

We have found that maximum results are obtained by simultaneously diffusing gold and platinum impurities into the misfit dislocation regions after the regions are formed. This can be achieved with a gold and platinum Filmtronic spin-on used as a metallic dopant. It is believed that, because the metals have different activation energies, different and distant trap energies are present. Diffusion of the gold and platinum at 810° C. for 60 minutes has resulted in power rectifiers with a switching time in the 25–30 nano second range.

It should now be appreciated that the present invention is a practical application of misfit dislocation techniques. The misfit dislocations are associated with deep energy levels in the energy gap of silicon. Misfit dislocations act as localized lifetime killers. The employment of such misfit dislocations is a controllable, clean technique for increasing switching speed of power rectifiers and reducing the minority carrier lifetime of multilayer devices.

In addition, misfit dislocations are effective gettering sites for metallic impurities. Small amounts of gold and platinum can easily be incorporated into the region of misfit dislocations, leaving the remaining silicon layers with minimal metallic impurity precipitates.

While only a single embodiment of the present invention has been disclosed for purposes of illustration, it is obvious that many variations and modifications could be made thereto. It is intended to cover all of these variations and modifications which fall within the scope of the present invention, as defined by the following claims:

We claim:

1. A method for fabricating an epitaxial material in a CVD reactor by growing an epitaxial layer on a silicon wafer under conditions which result in the formation of region containing misfit dislocations, the water being at a given temperature, the method comprising the steps of:

lowering the temperature of the Si water about 50° C. from the original temperature; introducing a germanium containing gas into the reactor to grow a silicon layer containing about 2 or 3 percent of germanium; purging the chamber; heating the wafers to the original temperature; growing a first substantially Ge-free Si layer; purging the chamber, growing a second substantially Ge-free Si layer; etching the surface of the said second Ge-free Si layer and removing a part of said second Ge-free Si layer and purging the chamber.

2. The method of claim 1 further comprising the following steps after the first purging of the chamber: growing a substantially Ge-free Si layer; introducing a germanium containing gas into the reactor to grow a silicon layer containing about 2 or 3 percent of germanium and purging the chamber.

3. The method of claim 2 further comprising the step of repeating the steps mentioned in claim 2 two or more times.

4. The method of claim 1 further comprising the steps of introducing germanium containing gas into the chamber to form a second germanium containing layer over the first germanium-free layer.

5. The method of claim 4 wherein the step of growing a substantially second germanium free silicon layer comprises the steps of growing a first substantially germanium free silicon sublayer, purging the chamber and growing a second substantially germanium free silicon sublayer.

6. The method of claim 1 further comprising the steps of forming a second region of misfit dislocations in the epitaxial layer spaced from the second germanium free silicon layer.

7. The method of claim 6 further comprising the steps of forming a third region of misfit dislocations in the epitaxial layer spaced from the second region.

8. The method of claim 1 further comprising the steps of diffusing a portion of the epitaxial layer with a conductivity type opposite that of the substrate to form a P/N junction, proximate the region of misfit dislocations.

9. The method of claim 1 further comprising the step of simultaneously introducing gold and platinum impurities into the region of misfit dislocations.

10. The method of claim 1, 2, or 3 where the processing of the epi wafer after the epi growth contains a step of a simultaneous diffusion of Pt and Au into the wafer.

11. The method of claim 1, 2 or 3 wherein during the epi growth a gold doped wafer, is placed in the chamber as a source of Au dopant for the other wafers.

* * * * *